US005862232A

United States Patent [19]

Shinbara et al.

[11] Patent Number: 5,862,232

[45] Date of Patent: Jan. 19, 1999

[54] SOUND PITCH CONVERTING APPARATUS

[75] Inventors: Hisako Shinbara, Yokohama; Mitsuo Matsumoto; Takuma Suzuki, both of Yokosuka, all of Japan

[73] Assignee: Victor Company of Japan, Ltd., Yokohama, Japan

[21] Appl. No.: 773,192

[22] Filed: Dec. 27, 1996

[30] Foreign Application Priority Data

Dec. 28, 1995 [JP] Japan .................................... 7-353508

[51] Int. Cl.[6] ........................................................ H03G 3/00

[52] U.S. Cl. .............................. 381/61; 704/207; 84/657; 381/98

[58] Field of Search ................................ 381/61, 98, 124; 704/207; 84/657

[56] References Cited

U.S. PATENT DOCUMENTS

| | | | |
|---|---|---|---|
| 5,103,431 | 4/1992 | Freeman et al. . | |
| 5,248,845 | 9/1993 | Massie et al. . | |
| 5,285,498 | 2/1994 | Johnston | 381/2 |
| 5,303,346 | 4/1994 | Fessler et al. . | |
| 5,327,521 | 7/1994 | Savil et al. . | |

FOREIGN PATENT DOCUMENTS

| | | |
|---|---|---|
| 59-204096 | 11/1984 | Japan . |
| 60-129797 | 7/1985 | Japan . |
| 1-93796 | 4/1989 | Japan . |
| 6-314099 | 11/1994 | Japan . |

*Primary Examiner*—Forester W. Isen
*Attorney, Agent, or Firm*—Michael N. Meller

[57] ABSTRACT

A sound pitch converting apparatus for shifting a pitch of a sound signal, the apparatus utilizes a first windowing device for dividing the sound signal into a series of multiple frames and shaping an envelope of the frames, a pitch frequency detecting device for detecting a pitch frequency within each frame, a Fourier transform device for transforming each frame signal into a frequency domain, a frequency shift device for shifting all frequency components in the Fourier transformed frame signal higher or lower by a desired degree, a harmonics level controlling device for controlling levels of harmonics contained in the frequency shifted frame signal responsive to a detected pitch frequency, an inverse Fourier transform device for transforming the harmonics level controlled frame signal back into a time domain, and a second windowing device for shaping an envelope of frame signal outputted from the inverse Fourier transform device and for combining the respective frames into a pitch changed sound signal.

3 Claims, 3 Drawing Sheets

SOUND PITCH CONVERTING APPARATUS

BACKGROUND OF THE INVENTION

1. Field of the Invention

The present invention relates to a sound pitch converting apparatus such as a KARAOKE (sing along a melody) player and a sound and image editor for shifting sound pitch or an original frequency of the sound and particularly to an apparatus which can easily shift a sound pitch maintaining the original sound characteristics without causing sound deterioration.

2. Description of the Related Art

A conventional sound pitch converting apparatus such as a conventional karaoke player has a function called a key control for shifting a pitch of accompanying sound to adjust it to a singing player's register. This key control shifts the musical sound pitch by changing a reproducing speed of the accompanying sound of analogue signal.

Recently, a communication karaoke system has been developed, in which a music provider stores a wide variety of songs and delivers them to a plurality of terminal users in response to their requests.

Digital data of such a delivered song consist of character data for displaying and changing colors of characters synchronously with an accompaniment music, a MIDI (Musical Instrument Digital Interface) signal for driving terminal synthesizer to reproduce the accompaniment music, and a compressed sound signal for reproducing natural voices of male or female accompaniment chorus.

The MIDI signal of this karaoke system can be changed in their sound pitches by controlling settings of the synthesizer to be higher or lower in frequency than the original pitch, without changing the original tempo.

However, it is difficult to change the sound pitch of the natural voices of male or female accompaniment chorus without alterations of its tempo and characteristics of the original voices, and without causing deterioration of the sound quality, because it is not a MIDI signal but an analogue signal without having a pitch control information.

Recently, an audio/video editing apparatus is developed which edits digital sound signals, however, it fails to change sound pitches without losing high quality of original sounds.

There are mainly two conventional methods which change sound pitch but keep an original tempo.

One of them is a method of sampling and processing a sound signal in a time domain. When the sound pitch is intended to be raised two times the original for example, the sound signal is divided into predetermined segments, and data of these divided sound signals are read out at two times of the original readout speed to obtain a doubled pitch signal. Or, a pitch frequency (the lowest frequency exhibited when a divided signal segment is analyzed in its frequency spectrum, "pitch frequency" is also called "fundamental frequency") of each of the divided sound signal segments is detected and doubled to obtain the doubled pitch signal. In either case, a divided time period corresponding to the predetermined segment is filled up by using the doubled pitch signal repeatedly. Thus, the pitch frequency is doubled without changing the original tempo of the sound. A problem in this method is smooth connection of the doubled pitch signal segments. In fact, the reproduced sound is deteriorated because of an imperfect connection, and the characteristics of the original sound is distorted.

Another method uses a Fourier transform which deals with the sound signals in a frequency domain. The sound signal is divided into a plurality of predetermined segments.

Amplitude and phase components of the divided signal segments in the frequency domain are extracted by a Fourier transform, and are shifted by desired amounts respectively.

Then, the shifted amplitude and phase components are reformed back to the time domain by inverse-Fourier transform. After that, the pitch changed sound signal segments are connected each other. However, this method has been evaluated by the present inventors that the reproduced sound is unnatural and unacceptable.

Japanese patent Laid-Open Application No. 59-204096/1984 by the present applicant discloses another method using a Fourier transform. The sound signal is divided into a plurality of predetermined segments, which are then transformed by Fourier transform. A pitch frequency of the transformed sound signals is detected. Only components around this detected pitch frequency are shifted by a predetermined value.

The method disclosed in Japanese patent Laid-Open Application No. 59-204096/1984 has a problem that harmonic sounds left without shifting remind a listener of their original pitch. As a result, the listener hears both of the original and the shifted pitch sounds.

There is a similar pitch change requirement in other systems, such as tape recorders or VCRs, than the KARAOKE players, in those tape recorders or VCRs, the original sound pitch is desired to be kept when such apparatuses play in higher speed than the standard one.

SUMMARY OF THE INVENTION

Accordingly, a general object of the present invention is to eliminate the problems stated in the foregoing.

Another object of the present invention is to provide an improved performance sound pitch converting apparatus which has a simple circuit construction, a short processing time, and converts a sound pitch higher or lower than the original, without sound deterioration and keeps a natural sound characteristic of the original sound.

A specific object of the present invention is to provide an improved sound pitch converting apparatus for shifting a pitch of sound signal by a predetermined rate, which has a first windowing device for dividing an inputted sound signal in a digital format into a series of multiple frames and shaping an envelope of each frame of the divided multiple frames, a pitch frequency detecting device for detecting a pitch frequency within the each frame, a Fourier transform device for transforming the each frame of sound signal into a frequency domain signal, a frequency shift device for shifting all frequency components in an output of the Fourier transform device by a desired degree, a harmonics level controlling device for controlling levels of harmonics contained in an output of the frequency shift device in response to a detected pitch frequency by the pitch frequency detecting device, an inverse Fourier transform device for transforming an output of the harmonics level controlling device into a time domain signal, and a second widowing device for shaping an envelope of respective frames of sound signal outputted from the inverse Fourier transform device, and for combining the respective frames into a pitch changed sound signal.

DETAILED DESCRIPTION OF THE PREFERRED EMBODIMENT

The present invention will now be described in detail with reference to the accompanying drawings.

Figure 1:
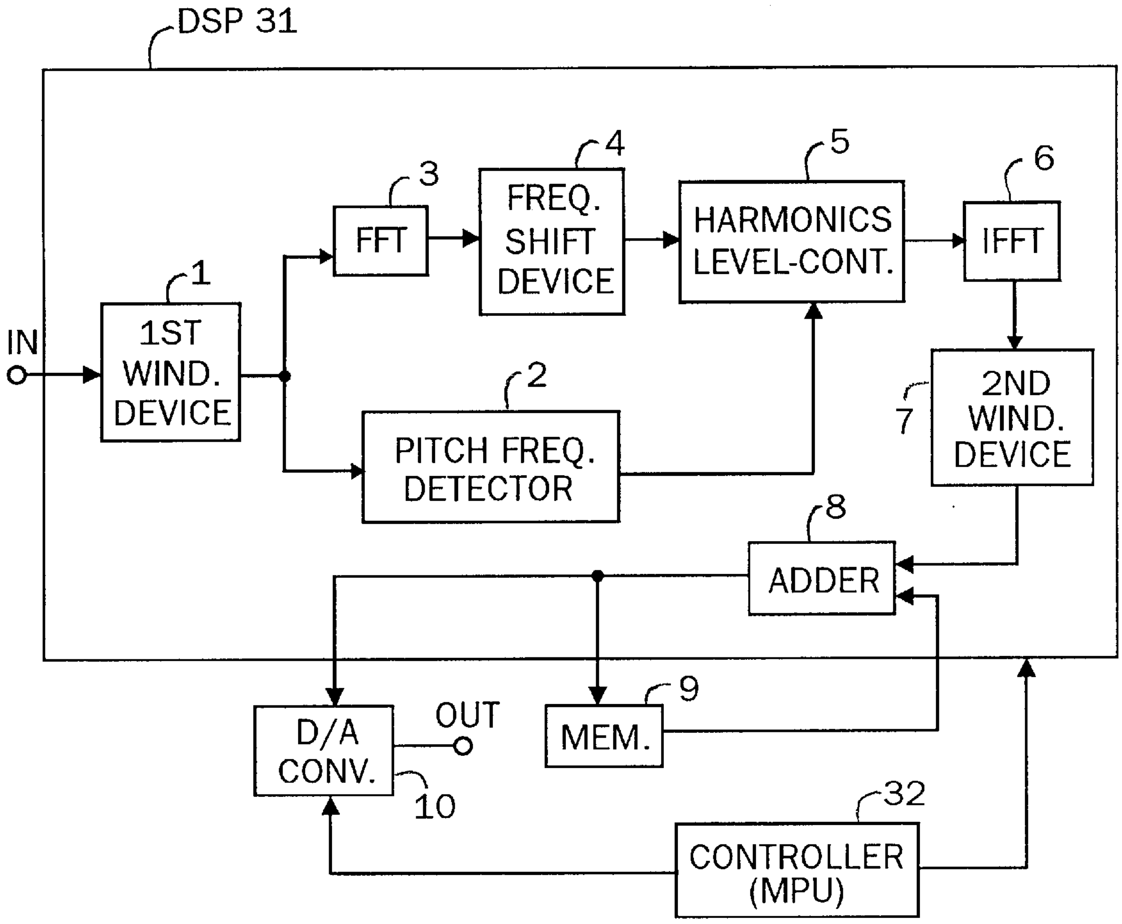
FIG. 1 is a block diagram of an embodiment of a sound pitch converting apparatus of the present invention.

FIG. 1 is a block diagram of an embodiment of a sound pitch converting apparatus of the present invention.

Figure 2:
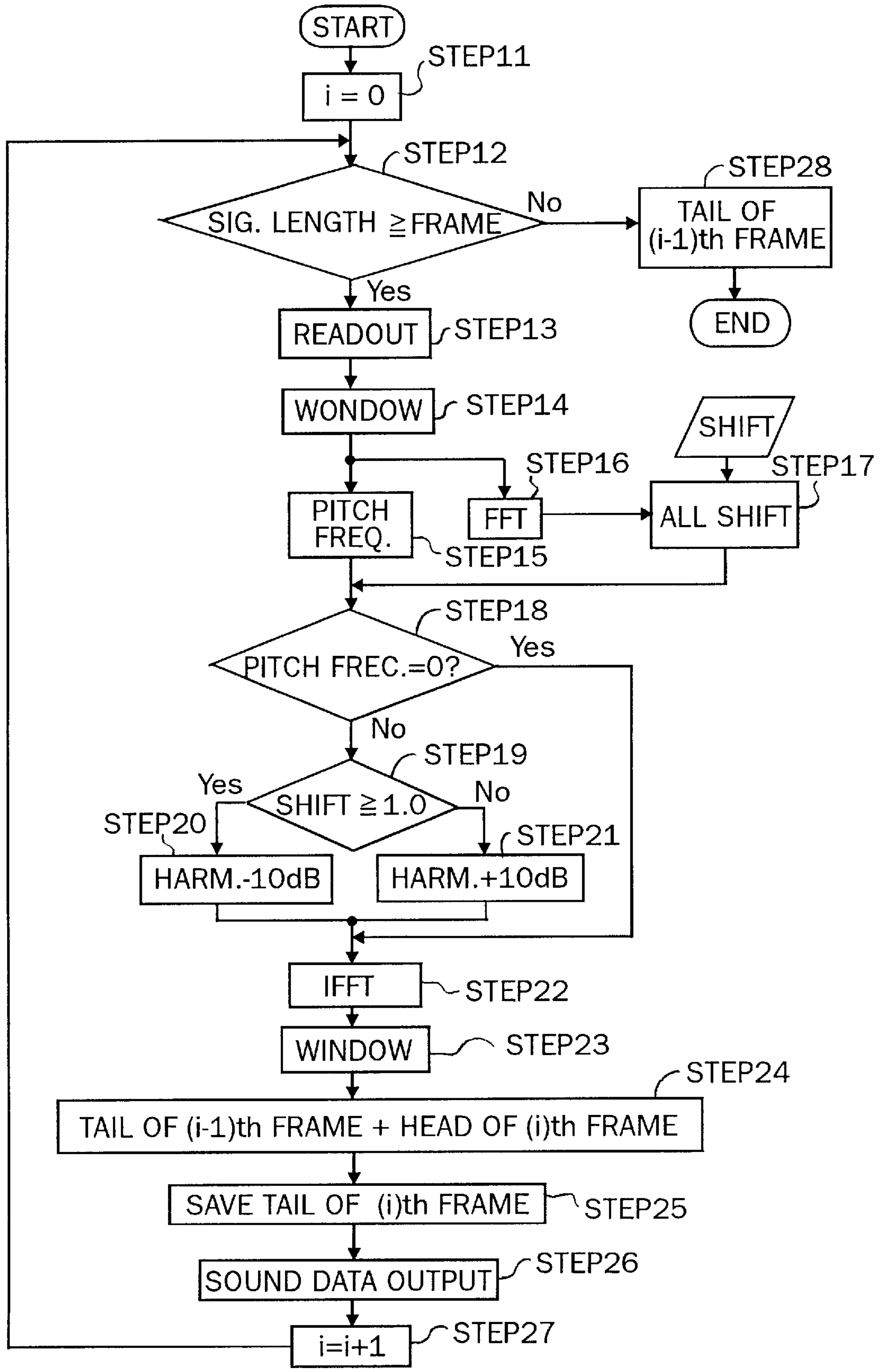
FIG. 2 is a flowchart of signal processing performed by the embodiment of the sound pitch converting apparatus of the present invention.

FIG. 2 is a flowchart of signal processing performed by the embodiment of the sound pitch converting apparatus of the present invention.

Figure 3A:
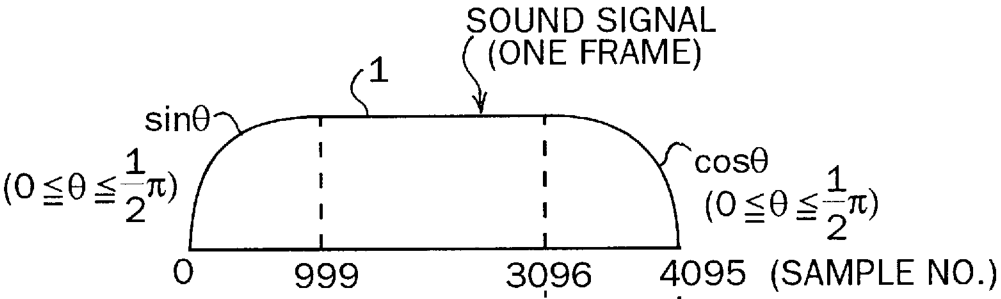
FIGS. 3(A) through 3(C) show a coupling process of two adjacent signal segments performed in the embodiment of the present invention by utilizing a window function.
Figure 3B:
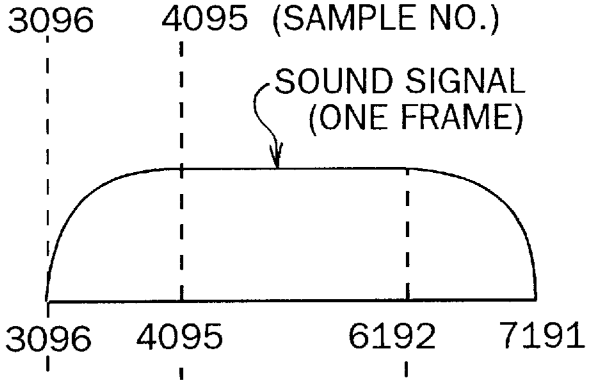
Figure 3C:
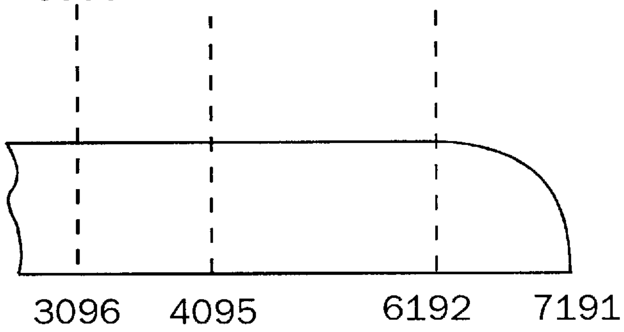

FIGS. 3(A) through 3(C) show a coupling process of two adjacent signal segments performed in the embodiment of the present invention by utilizing a window function.

An explanation will be given of an exemplary apparatus which changes a pitch of sound signal having a sampling frequency fs of 44.1 kHz by 3 halftones (chromatic scale) higher.

At first, a frame number "i", a signal processing unit, is set to an initial value (step 11). Digital sound signal to be pitch changed is inputted to a first windowing device 1. If a length of the digital sound signal (hereinafter referred to as "sound signal" unless otherwise noted) is longer than the frame (step 12→yes), the sound signal is divided into a plurality of frames each having a predetermined number of samples, such as 4096 samples (sample "0" to sample "4095") for example, by the first windowing device 1, and these 4096 samples are read out (step 13) as such that the samples zero through 999th which are a head part of the frame, are amplitude-controlled (of its analog envelope) to be a sine wave by a window function of the first windowing device 1, and outputted. The 3096th through 4095th of the samples which are a tail part of the frame, are amplitude-controlled to be a cosine wave, and outputted. The other samples (1000~3095) therebetween are read out to have a level "1" as shown in FIG. 3(A), and outputted. These three processes are performed in a step 14. The above amplitude control applied to the head and tail parts of each frame as the sine and cosine waves respectively, is for a smooth coupling of adjacent frames by providing fade-in and fade-out effects to respective ends of frame (shown in FIG. 3).

Optimum sample numbers in the head and tail parts, namely the sine and cosine period of frame, are determined through experiments by changing the number between 200 and 2000 samples. As a result, 500 to 1500 samples are examined to be optimum for most of the sound sources, which correspond to a time span of about 10 to 35 msec of the sound sources. Accordingly, the width of the time window for the head or the tail part in this embodiment is determined to be 1000 samples, and this corresponds to a time span of about 23 msec. The width of the time window for the head or the tail part can be changed within a range smaller than a half frame length.

Series of frames of the sound signals, divided by the first windowing device 1 to a plurality of frames, is supplied to a pitch frequency detector 2, wherein the lowest frequency in a frequency spectrum of the sound signal in each frame is extracted by utilizing an autocorrelation function or a cepstral technique (step 15). The series of frames of the sound signals is also supplied to a Fourier Transform (FFT) device 3, and transformed from a time domain signal to a frequency domain signal (step 16), then, each sample, which is in the time domain at the beginning, is transformed to the frequency domain, thus, a "sample number" in the time domain becomes "frequency". When the sound signal having a sampling frequency fs is divided into a plurality of frames each having N (positive integer) samples, a sample number of a signal outputted from FFT device 3 represented by a frequency p Hz is (p×N/fs)th thereof. In this embodiment, fs is 44.1 kHz, and N is 4096. Then, the sample number of frequency p Hz is (p×4096/44100)th, where fractions are rounded.

A frequency shift device 4 shifts a real part and an imaginary part of the Fourier transformed sound signal frequency by 3 halftones, an amount of pitch shift in this embodiment. Shifting a sound pitch by an octave, i.e. 12 halftones higher means that the original sound frequencies are doubled. Therefore, to shift a sound signal by "h" (positive integer) halftones is to make the sound signal frequencies $2^{h/12}$ times. In this embodiment, "h" is 3. Then, the amount of shift is $2^{3/12}$, which is about 1.19. As a result, an (n)th sample is shifted to (1.19×n)th. When a pitch frequency is $p_1$ Hz, the sample number of shifted frequency is $p_1 \times 2^{h/12} \times N/fs$.

Voice of a vocalist is examined to show that high harmonics contained are low in level as his pitch becomes high, and high in level as the pitch becomes low. Levels of these harmonics subject to a quality of reproduced voice. Thus, the quality of sound is improved by manipulating levels of the harmonics after shifting all of the sound signal frequencies to higher or lower.

When an outputted pitch frequency of the pitch frequency detector 2 is zero (no output) (step 18→Yes), a harmonics level controller 5 outputs the pitch frequency to an inverse Fourier transform device 6 without any operation (step 22).

When the pitch frequency, output of the pitch frequency detector 2, is a positive number (step 18→No), the harmonics level controller 5 controls the levels of harmonics of the pitch frequency. When all frequency components in the frame are shifted higher, that is, a degree of the shift $2^{h/12}$ is equal to or more than 1, (step 19→Yes), the levels of the harmonics of the shifted sound signal are decreased (step 20). On the other hand, when all the frequency components are shifted lower (step 19→no), the levels of the harmonics of the shifted sound signal are increased (step 21). The step 19 corresponds to that a degree of the shift is less than 1. Through the experiments, it is revealed that the level of about 10 dB of decrease or increase of the harmonics of the detected pitch frequency is optimum for maintaining original sound quality in the shifted sound signal. Thus, in this embodiment, this level is chosen to be 10 dB.

Specifically, when the detected pitch frequency is 200 Hz, and shifted by 3 halftones, the shifted pitch frequency becomes 200×1.19 Hz. Thus, the harmonics after the shift become 200×1.19×m. Here, "m" is an integer more than 1. Respective real and imaginary parts of Fourier transformed data of these frequencies are multiplied by $10^{-0.5}$, this means that these data are increased by −10 dB. When generalized, a sample number of "m"th harmonics shifted "h" halftones of the pitch frequency $p_1$, is $(m \times p_1 \times 2^{h/12} \times N/fs)$th, then the real part and the imaginary part of the Fourier transformed data of this sample number is multiplied by $10^{-0.5}$ or $10^{0.5}$, which means that the data is changed by −10 dB or 10 dB.

Afterwards, converted respective data are supplied to the inverse Fourier transform (IFFT) device 6, and transformed from the frequency domain signal to the time domain signal (step 22).

A first frame of the sound signal, inverted back to the time domain signal by the IFFT device 6, is supplied to a second windowing device 7. The zero through 999th samples in the first frame, which are the head part of the first frame, are shaped to be sine wave by the second windowing device 7, and outputted therefrom. The 3096th through 4095th samples, which are the tail part of the first frame, are shaped to be cosine wave by the second windowing device 7, and outputted therefrom. The rest of the samples between the head and tail parts are recovered to have a constant level "1", and outputted. These three windowing processes are performed in the step 23.

The 3096th through 4095th of the samples are stored in a memory 9 through an adder 8 which will be explained later. The zero through 3095th of the samples are outputted to a D/A (digital to analogue) converter 10.

A subsequent second frame of the sound signal is produced as such that the first windowing device 1 reads out the inputted sound signal from the sample 3096 to the sample 7191 as shown in FIG. 3(B), so that the 3096th through 4095th of the samples are redundantly read out. Otherwise, the samples from 3096 to 7191 of the second frame are subjected to the same signal processing performed for the frame, up to the storing process in the memory 9.

By an adder 8, the samples 3096 to 4095 of the tail part of the first frame and stored in the memory 9 are added to the samples 3096 to 4095 of the newly read out and processed as the head part of the second frame (step 24). Since the cosine tail part and the sine head part are added together in this adding process, the result is a smooth coupling of the 2 frames having a level "1" as shown in FIG. 3(C). The samples 6192 to 7191, the tail part of the second frame are stored in the memory 9 (step 25).

Thus added samples 3096 to 4095 and the samples 4096 to 6191 which are shaped to have level "1" are outputted from the second windowing device 7 to a D/A converter 10 (step 26). These process are repeated by a controller (MPU) 32 until the end of the series of sound signal as the frame number "i" is increased for every cycle (step 27). The sound signal, converted from a digital signal to an analogue signal, is outputted from the D/A converter 10.

It should be noted that the first and second widowing devices 1 and 7, the pitch frequency detector 2, the FFT 3, the frequency shift device 4, the harmonics level-controller 5, the IFFT 6 and the adder 8 are realized by one DSP 31. And, the DSP 31, the memory 9 and the D/A converter 10 are controlled by the controller (MPU) 32 to perform the processes shown in FIG. 2.

In this embodiment, a total sample number of each frame is 4096, but the sample quantity can be different. As a result of experiments, it is found that an optimum sample number per frame is to be equivalent to 10 to 25 Hz per sample for good quality sound. The number of samples in a frame is preferable to be $2^n$ (n is a positive integer) in consideration of digital signal processing including the FFT. Accordingly, in this embodiment, in the case of the sampling frequency being 44.1 kHz, the number of samples in a frame is desirable to be 2048 or 4096. The 2048 samples per frame and the 4096 samples per frame are equivalent to 21.5 Hz/sample and 10.8 Hz/sample respectively. When the sampling frequency is 22.05 kHz, such as a sound data of MPEG2 audio, the number of samples in a frame is desirable to be 1024 or 2048. The 1024 samples per frame and 2048 samples per frame are equivalent to 21.5 Hz/sample and 10.8 Hz/sample respectively.

As to a sound data having a sampling frequency of 44.1 kHz, experiments have been performed for the cases having the number of samples per frame of 512, 1024, 2048, 4096, and 8192. In the case of 512 samples, the sound pitch shift was inaccurate. In the case of 1024 samples, a quality of sound was not acceptable. In the case of 8192 samples, desired pitch shift was obtained, and a kind of reverberation effect was detected. In the cases of 2048 and 4096 samples, the best sound quality was obtained.

As explained in the foregoing, the advantage of the present invention is to provide a high performance sound pitch converting apparatus which has a simple circuit construction, a short processing time, and converts a sound pitch higher or lower than the original, without sound deterioration, and characteristics of the original vocal is maintained, by utilizing a first windowing device for dividing and shaping a sound signal, a pitch frequency detecting device for detecting a pitch frequency of the sound signal, a Fourier transform device for transforming the sound signal into a time domain, a frequency shift device for shifting a Fourier transformed digital sound signal by predetermined value, a harmonics level controller for manipulating a level of harmonics of the peak frequency, an inverse Fourier transform device for transforming the pitch-shifted and harmonics level controlled sound signal back to the time domain signal, a second windowing device for reshaping the inverse Fourier transformed sound signal, and an adder for coupling divided sound signal frames.

What is claimed is:

1. A sound pitch converting apparatus for shifting a pitch of sound signal by a predetermined rate comprising:

first windowing means for dividing said sound signal inputted to said apparatus, into a series of multiple frames including a first frame and a second frame subsequent to the first frame, and for shaping an envelope of head and tail parts of each of the first and second frames into a sine-wave of first ½ π period and a cosine-wave of first ½ π period respectively and forming a constant level part between said head and tail parts;

pitch frequency detecting means for detecting a pitch frequency within each of said series of multiple frames outputted from said first windowing means;

Fourier transform means for transforming said series of multiple frames of the sound signal outputted from said first windowing means, into a frequency domain signal;

frequency shift means for shifting all frequency components in an output of said Fourier transform means by a desired degree;

harmonics level control means for controlling levels of harmonics contained in an output of said frequency shift means in response to a detected pitch frequency by said pitch frequency detecting means;

inverse Fourier transform means for transforming an output of said harmonics level control means into a time domain signal; wherein said harmonics level control means operates such that when an output or the pitch frequency detecting means is zero, the levels of harmonics in the output of said frequency shift means are not controlled whereby the output of the frequency shift means is passed to said inverse Fourier transform means, and when the output of the pitch frequency detecting means is present, the levels of harmonics in the output of said frequency shift means are controlled;

second windowing means for shaping an envelope of head and tail parts of each of the first and second frames included in an output of said inverse Fourier transform means, so that said head part is a sine-wave of first ½ π period and said tail part is a cosine-wave of first ½ π period and forming a constant level part between said head and tail parts; and coupling means for coupling said tail part of said first frame with said head part of said second frame so that said tail-and head parts overlap each other.

2. A sound pitch converting apparatus as claimed in claim 1 wherein an overlapped portion between said first frame and said second frame at said tail and head parts of respective first and second frames is 10 and 35 msec.

3. A sound pitch converting apparatus as claimed in claim 1, wherein when all of said frequency components are shifted higher than originals, said harmonies level controlling means decreases the levels of said harmonics, and when all of said frequency components are shifted lower than originals, said harmonics level controlling means increases the levels of said harmonics.

* * * * *